(12) United States Patent
Hsu et al.

(10) Patent No.: US 9,437,600 B2
(45) Date of Patent: Sep. 6, 2016

(54) FLASH MEMORY STRUCTURE AND METHOD OF MAKING THE SAME

(71) Applicant: Powerchip Technology Corporation, Hsinchu (TW)

(72) Inventors: Cheng-Yuan Hsu, Hsinchu (TW); Tzung-Hua Ying, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/685,614

(22) Filed: Apr. 14, 2015

(65) Prior Publication Data
US 2016/0071854 A1 Mar. 10, 2016

(30) Foreign Application Priority Data
Sep. 4, 2014 (TW) .............................. 103130630 A

(51) Int. Cl.
| | |
|---|---|
| *G11C 16/10* | (2006.01) |
| *H01L 27/115* | (2006.01) |
| *H01L 29/788* | (2006.01) |
| *H01L 29/66* | (2006.01) |
| *H01L 29/423* | (2006.01) |
| *H01L 21/3213* | (2006.01) |
| *H01L 21/28* | (2006.01) |
| *G11C 16/26* | (2006.01) |
| *G11C 16/04* | (2006.01) |
| *G11C 16/14* | (2006.01) |

(52) U.S. Cl.
CPC ..... *H01L 27/11521* (2013.01); *G11C 16/0433* (2013.01); *G11C 16/10* (2013.01); *G11C 16/14* (2013.01); *G11C 16/26* (2013.01); *H01L 21/28008* (2013.01); *H01L 21/28273* (2013.01); *H01L 21/32133* (2013.01); *H01L 21/32139* (2013.01); *H01L 29/42328* (2013.01); *H01L 29/66825* (2013.01); *H01L 29/788* (2013.01)

(58) Field of Classification Search
CPC ...................................................... G11C 16/10
USPC ......................................... 365/185.1, 185.01
See application file for complete search history.

(56) References Cited

U.S. PATENT DOCUMENTS

| | | | | |
|---|---|---|---|---|
| 5,824,583 | A | * 10/1998 | Asano ................ | G11C 16/0483 257/E27.103 |
| 6,788,573 | B2 | 9/2004 | Choi | |
| 7,122,430 | B2 | * 10/2006 | Sato ....................... | H01L 27/105 257/E21.685 |

(Continued)

FOREIGN PATENT DOCUMENTS

| | | |
|---|---|---|
| JP | 2004186319 A | 7/2004 |
| JP | 200660138 A | 3/2006 |

(Continued)

*Primary Examiner* — Son Mai
(74) *Attorney, Agent, or Firm* — Winston Hsu; Scott Margo

(57) ABSTRACT

A method of making a flash memory includes providing a substrate. Then, a first insulating layer, a first conductive layer and a second insulating layer are formed to cover the substrate. Later, a first trench is formed in the first conductive layer and the second insulating layer. After that, a second conductive layer and a mask layer are formed to cover the second insulating layer, and the second conductive layer fills up the first trench. Then, the mask layer are patterned to form patterned mask layers. Subsequently, a spacer is formed on the sidewall of the patterned mask layer. Then, an etching process is carried out by using the patterned mask layers and the spacer as a mask so as to form a first gate structure and a second gate structure.

5 Claims, 7 Drawing Sheets

(56) References Cited

U.S. PATENT DOCUMENTS

| | | | |
|---|---|---|---|
| 9,224,475 B2* | 12/2015 | Sel | G11C 16/0483 |
| 2007/0057316 A1* | 3/2007 | Yaegashi | H01L 27/115 |
| | | | 257/321 |
| 2007/0090445 A1 | 4/2007 | Lee et al. | |
| 2007/0108496 A1* | 5/2007 | Ino | H01L 21/2815 |
| | | | 257/314 |
| 2009/0065845 A1* | 3/2009 | Kim | H01L 27/105 |
| | | | 257/316 |
| 2015/0287738 A1* | 10/2015 | Kuo | G11C 5/06 |
| | | | 257/326 |

FOREIGN PATENT DOCUMENTS

| | | |
|---|---|---|
| JP | 201021496 A | 1/2010 |
| JP | 201040995 A | 2/2010 |
| JP | 2012129522 A | 7/2012 |
| JP | 201326305 A | 2/2013 |
| JP | 201422394 A | 2/2014 |
| TW | I261253 | 9/2006 |
| TW | 201203468 | 1/2012 |
| TW | 201310455 | 3/2013 |

* cited by examiner

| | Select Gate Voltage | Control Gate Voltage | Substrate | Source | Drain |
|---|---|---|---|---|---|
| Erasing Fowler-Nordheim Tunneling Effect | 0 Voltage | -7~-11 volts | 7~11 volts | 0 Voltage or floating | 0 Voltage or floating |
| Erasing Band-To-Band Tunneling Effect | 0 Voltage | -7~-11 volts | 0 Voltage | 5~9 volts | 0 Voltage or floating |
| Programming | 1~4 volts | 8.5~13 volts | 0 Voltage | 3~5.5 volts | 0 Voltage or 1~2 μA |
| Reading | Vcc | Vcc | 0 Voltage | 0 Voltage | 1 volt |

FLASH MEMORY STRUCTURE AND METHOD OF MAKING THE SAME

CROSS REFERENCE TO RELATED APPLICATION

This application claims the benefit of Taiwanese Priority Patent Application No. 103130630, filed on Sep. 4, 2014, the contents of which are hereby incorporated by reference in their entirety for all purposes.

BACKGROUND OF THE INVENTION

1. Field of the Invention

The present invention relates to a flash memory gate structure and a method of making it. In particular, the present invention is directed to a gate structure with a smaller gap disposed between the select gate structure and the floating gate structure as well as a method of making it.

2. Description of the Prior Art

A flash memory is a non-volatile memory. The information is nevertheless stored in the memory in the absence of the supply of an external power supply. In the recent years, due to the advantages of the flash memory capable of electrically re-programming and re-erasing, it has been widely used in mobile phones, in digital cameras, in video players, in personal digital assistants (PDAs), or in a system on a chip (SOC).

However, in the current process of fabricating the flash memory of split gate type, a problem of overlay shift between the select gate and the control gate often happens. Another problem is complicated steps. Accordingly, a solution is needed to improve the situations.

SUMMARY OF THE INVENTION

In view of this, the present invention proposes a flash memory gate structure and a method of making it to solve the problems.

In accordance with one preferred embodiment of the present invention, a method of making a flash memory gate structure is provided. First, a substrate is provided. The substrate has an array region. Next, a first insulating layer, a first conductive layer and a second insulating layer are sequentially formed to cover the array region of the substrate. Later, at least one first trench is formed in the first conductive layer and in the second insulating layer. Then, a second conductive layer and a mask layer are formed in the array region to cover the second insulating layer. The second conductive layer fills up the first trench. Later, the mask layer is patterned to form a patterned mask layer. Next, a spacer is formed on the sidewall of the patterned mask layer. Afterwards, the patterned mask layers and the spacers are used as a mask to carry out an etching process so as to form a first gate structure and a second gate structure. The first gate structure includes the first trench and there is a gap disposed between the first gate structure and the second gate structure.

In accordance with another embodiment of the present invention, a flash memory structure is provided. The flash memory structure includes a first gate structure, a second gate structure, a source and a drain respectively disposed at two sides of the flash memory structure. The first gate structure and the second gate structure are formed on a substrate next to each other, and there is a gap disposed between the first gate structure and the second gate structure. The first gate structure and the second gate structure respectively include: a first insulating layer, a first conductive layer, a second insulating layer, a second conductive layer, a mask layer and a spacer to cover the sidewall of the mask layer. The first conductive layer and the second insulating layer of the first gate structure have a trench, and the second conductive layer extends to the trench to connect the first conductive layer. The first gate structure serves as a select gate and the second gate structure serves as a control gate and as a floating gate.

In accordance with another embodiment of the present invention, a method to read a flash memory structure is provided. The flash memory structure includes a first gate structure and the second gate structure formed on a substrate. The first gate structure includes a select gate and the second gate structure includes a control gate. There is a gap disposed between the first gate structure and the second gate structure. A source and a drain are respectively disposed in the substrate at two sides of the flash memory structure. The flash memory structure is read by applying a Vcc voltage to the select gate, applying 0 voltage to the substrate, applying 0 voltage to the source, applying 1 volt to the drain and applying a Vcc voltage to the control gate.

In accordance with another embodiment of the present invention, a method to program a flash memory structure is provided. The flash memory structure includes a first gate structure and the second gate structure formed on a substrate. The first gate structure includes a select gate and the second gate structure includes a control gate. There is a gap disposed between the first gate structure and the second gate structure. A source and a drain are respectively disposed in the substrate at two sides of the flash memory structure. The flash memory structure is programmed by applying 1-4 volts to the select gate, applying 0 voltage to the substrate, applying 3-5.5 volts to the source, applying 0 voltage or 1-2 µA to the drain and applying 8.5-13 volts to the control gate.

In accordance with another embodiment of the present invention, a method to erase a flash memory structure is provided. The flash memory structure includes a first gate structure and the second gate structure formed on a substrate. The first gate structure includes a select gate and the second gate structure includes a control gate. There is a gap disposed between the first gate structure and the second gate structure. A source and a drain are respectively disposed in the substrate at two sides of the flash memory structure. The flash memory structure is erased by applying 0 voltage to the select gate, applying 7-11 volts to the substrate, applying 0 voltage to the source or keeping the source floating, applying 0 voltage to the drain or keeping the drain floating, and applying −7 to −11 volts to the control gate.

In accordance with another embodiment of the present invention, a method to erase a flash memory structure is provided. The flash memory structure includes a first gate structure and the second gate structure formed on a substrate. The first gate structure includes a select gate and the second gate structure includes a control gate. There is a gap disposed between the first gate structure and the second gate structure. A source and a drain are respectively disposed in the substrate at two sides of the flash memory structure. The flash memory structure is erased by applying 0 voltage to the select gate, applying 0 voltage to the substrate, applying 5 to 9 volts to the source, applying 0 voltage to the drain or keeping the drain floating, and applying −7 to −11 volts to the control gate.

These and other objectives of the present invention will no doubt become obvious to those of ordinary skill in the art

DETAILED DESCRIPTION

The present invention will be described more fully hereinafter with reference to the accompanying embodiments and drawings to facilitate the understanding and the results of the present invention.

FIG. 1 to FIG. 7 illustrate the preferred embodiments to fabricate the gate of the flash memory of the present invention.

First, a substrate 10 is provided. The substrate 10 includes an array region A. Second, a first insulating layer 12, a first conductive layer 14 and a second insulating layer 16 are sequentially formed. The first insulating layer 12 and the second insulating layer 16 may be independently composed of a single layer insulating material or of a multiple layer insulating material, such as silicon oxide, oxy-nitrides, or a high-k dielectric material. In accordance with one preferred embodiment of the present invention, the first insulating layer 12 may be silicon oxide and the second insulating layer 16 may be a composite layer which is composed of silicon oxide and silicon nitride, such as oxide-nitride-oxide or oxide-nitride-oxide-nitride . . . etc. The first conductive layer 14 may be polysilicon, a metal silicide or a metal material of a specific work function. In accordance with one preferred embodiment of the present invention, the first conductive layer 14 may be polysilicon.

Figures 1, 2:
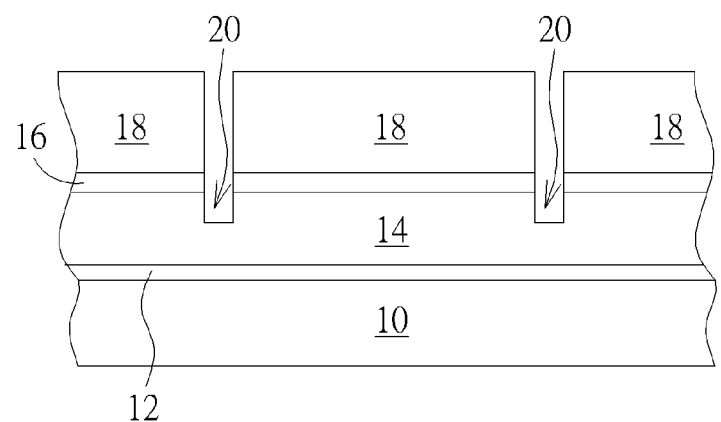
FIG. 1 to FIG. 7 illustrate the preferred embodiments to fabricate the gate of the flash memory of the present invention.

Next, as shown in FIG. 2, a patterned mask layer 18 is formed and the patterned mask layer 18 exposes the second insulating layer 16 of part of the array region A. Then, the patterned mask layer 18 serves as an etching mask to etch the second insulating layer 16 and the first conductive layer 14 to form multiple trenches 20 in the first conductive layer 14 and in the second insulating layer 16. The patterned mask layer 18 is removed afterwards.

Figure 3:
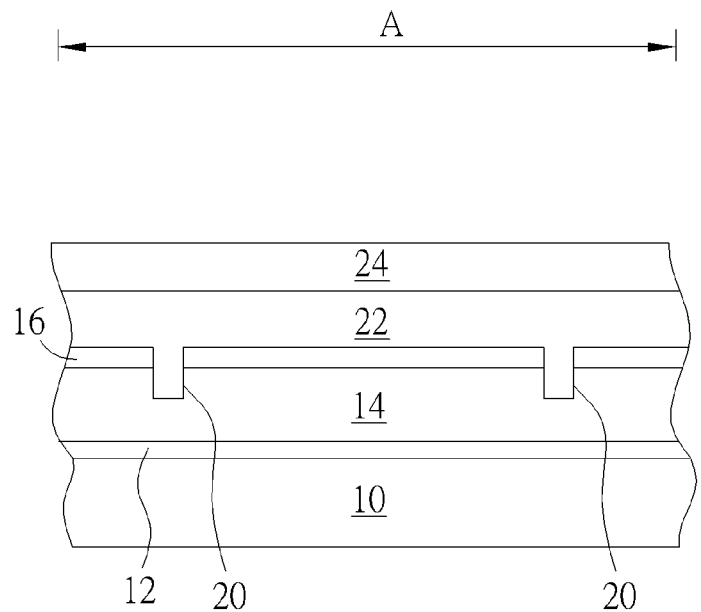

As shown in FIG. 3, a second conductive layer 22 and a mask layer 24 are sequentially formed to cover the second insulating layer 16 of the array region A, and the second conductive layer 22 fills up the trenches 20 in the array region A. The second conductive layer 22 may be polysilicon, a silicide or a metal material of a specific work function. The mask layer 24 may be silicon nitride or other suitable materials.

Figure 4:
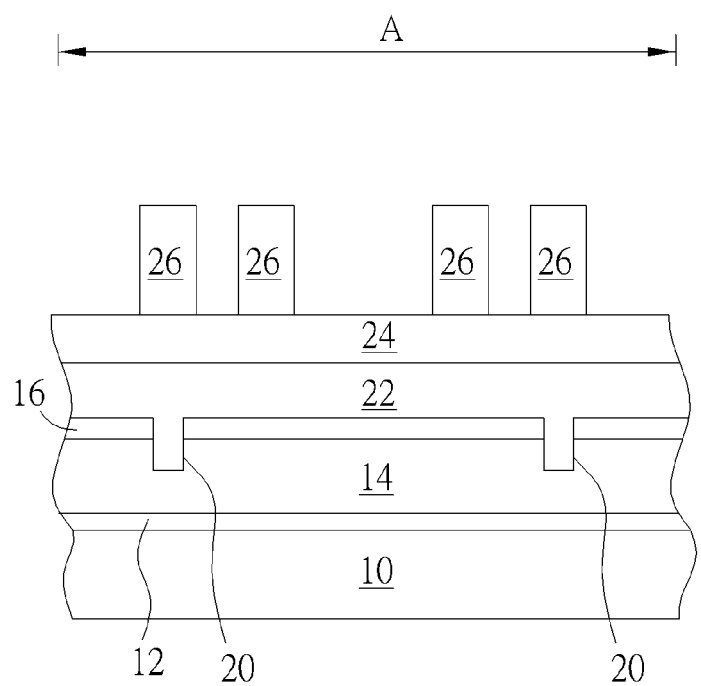
Figure 5:
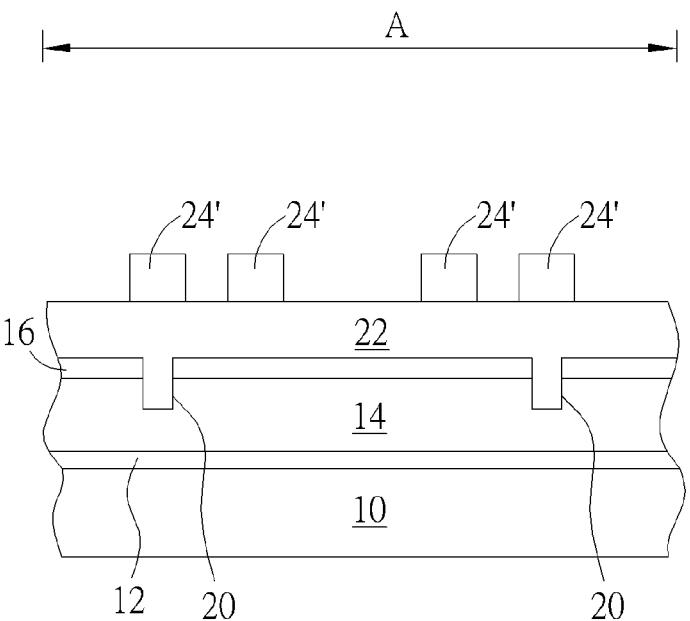
Figure 6:
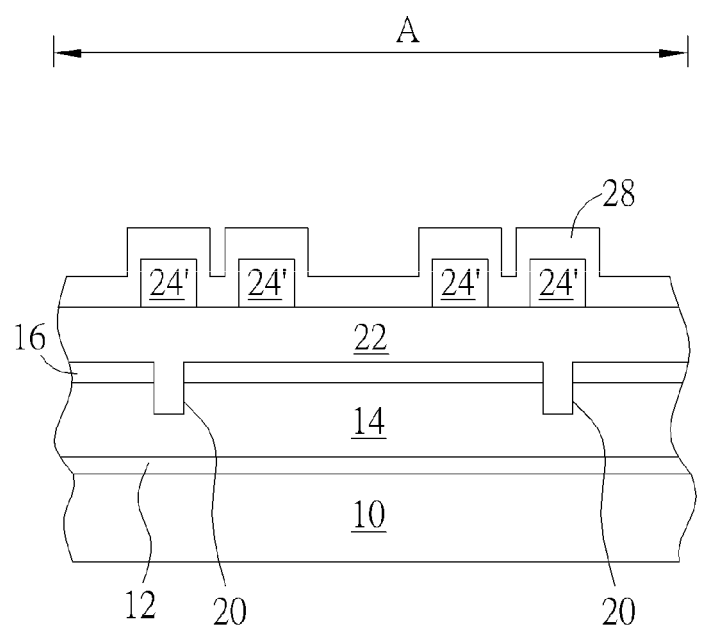
Figure 7:
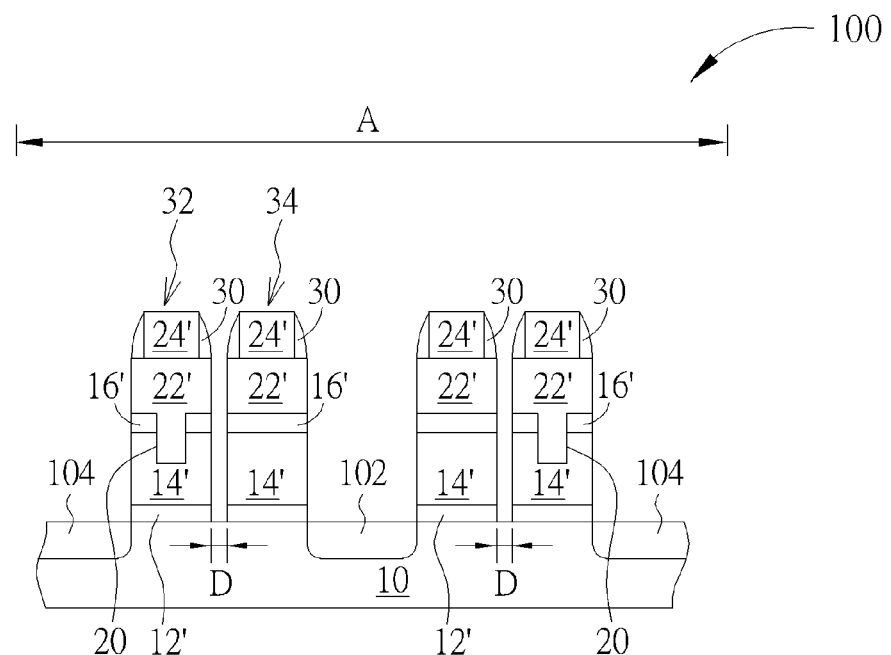

As shown in FIG. 4, a lithographic process along with a development process is used to form a patterned photoresist layer 26 and to expose the mask layer 24 of part of the array region A. In details, the patterned photoresist layer 26 defines the locations of the select gate structure, the control gate structure, and the floating gate structure in the following steps. Next, as shown in FIG. 5, the patterned photoresist layer 26 serves as a mask to etch the mask layer 24, and the second conductive layer 22 serves an etching stopping layer to form the patterned mask layer 24' in the array region A. Then, the patterned photoresist layer 26 is removed. As shown in FIG. 6, a spacer material layer 28 is conformally formed on the patterned mask layer 24'. As shown in FIG. 7, the spacer material layer 28 in the array region A is dry-etched to form a spacer 30 disposed on the sidewall of the patterned mask layer 24'. The spacer 30 and the patterned mask layer 24' then collectively serve as a mask to sequentially etch all the way to the second conductive layer 22, to the second insulating layer 16, to the first conductive layer 14 and to the first insulating layer 12 by self-alignment till the substrate 10 is exposed, to form the patterned first insulating layer 12', the patterned first conductive layer 14', the patterned second insulating layer 16' and the patterned second conductive layer 22', and to form a first gate structure 32 and a second gate structure 34. The first gate structure 32 includes the patterned first insulating layer 12', the patterned first conductive layer 14', the patterned second insulating layer 16', the patterned second conductive layer 22' and the trench 20. Besides, the first gate structure 32 later will serve as a select gate structure. The patterned second conductive layer 22' and the patterned second insulating layer 16' in the second gate structure 34 later will serve as a control gate structure. The patterned first conductive layer 14' and the patterned first insulating layer 12' later will serve as a floating gate structure. By now, the flash memory structure 100 of the present invention has been constructed. Later a source 102 and a drain 104 are formed in the substrate at the left side and at the right side of the flash memory structure 100.

Please go on to refer to FIG. 7, there is a small gap D disposed between the first gate structure 32 and the second gate structure 34. In accordance with one preferred embodiment of the present invention, the size of the gap D is between 50 Å and 400 Å. In addition, in accordance with another preferred embodiment of the present invention, the patterned mask layer 24' and the spacer 30 on the top side of the first gate structure 32 and on the second gate structure 34 may be removed.

Figure 8A:
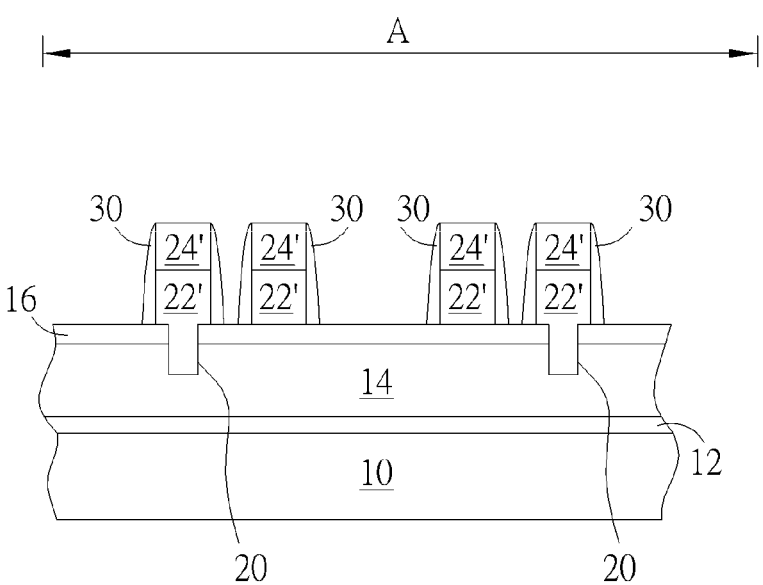
FIG. 8A illustrates a variant to fabricate the gate of the flash memory in accordance with one preferred embodiment the present invention.
Figure 8B:
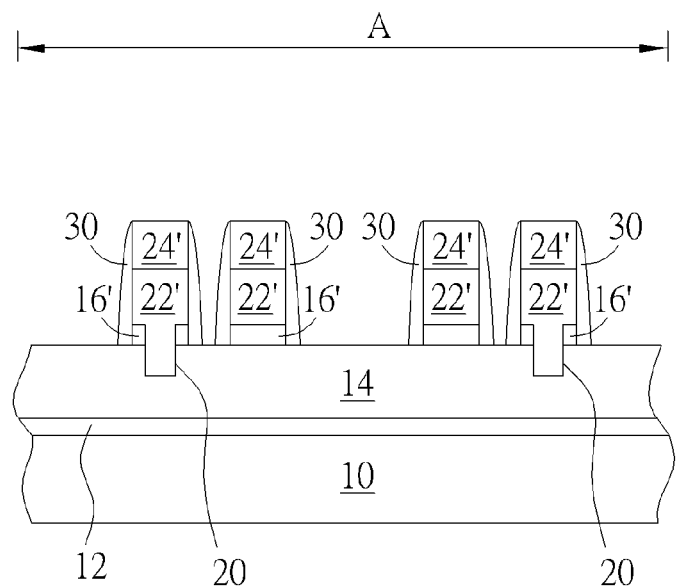
FIG. 8B illustrates a variant to fabricate the gate of the flash memory in accordance with another preferred embodiment the present invention.
Figure 8C:
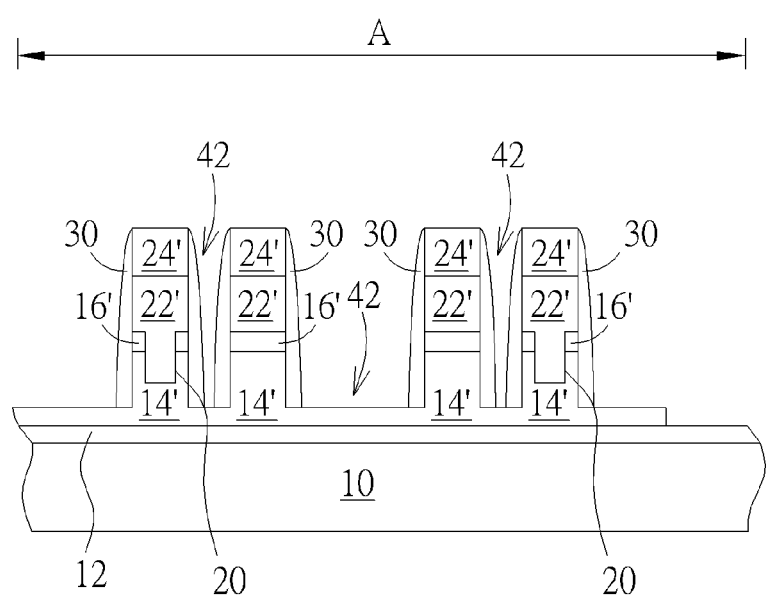
FIG. 8C illustrates a variant to fabricate the gate of the flash memory in accordance with another preferred embodiment the present invention.

In the previous FIG. 4, when the patterned photoresist layer 26 serves as a mask to etch the mask layer 24, the second conductive layer 22 serves an etching stopping layer. In accordance with another preferred embodiment of the present invention, the second insulating layer 16 and the first conductive layer 14 may respectively serve an etching stopping layer when the mask layer 24 is etched. Please refer to FIG. 5, FIG. 6, FIG. 7, FIG. 8A, FIG. 8B and FIG. 8C at the same time. As shown in FIG. 8A, after the mask layer 24 is etched, the patterned photoresist layer 26 serves as a mask to etch the second conductive layer 22 and the second insulating layer 16 serves an etching stopping layer. Then, the patterned second conductive layer 22' is formed and the spacer 30 formed in FIG. 7 extends from the patterned mask layer 24' downwards to and cover the sidewall of the patterned second conductive layer 22'. As shown in FIG. 8B, after the mask layer 24 is etched, the patterned photoresist layer 26 serves as a mask to etch the second conductive layer 22 and the second insulating layer 16 while the first conductive layer 14 serves an etching stopping layer to form the patterned second conductive layer 22' and the patterned second insulating layer 16'. The spacer 30 formed in FIG. 7 extends from the patterned mask layer 24' downwards to and cover the sidewall of the patterned second conductive layer 22' as well as the sidewall of the patterned second insulating layer 16'. As shown in FIG. 8C, after the mask layer 24 is etched, the patterned photoresist layer 26 serves as a mask to etch the second conductive layer 22 and the second insulating layer 16 and the first conductive layer 14 till multiple trenches 42 are formed in the patterned first conductive layer 14', and the first insulating layer 12 is optionally exposed. Accordingly, the patterned second conductive layer 22', the patterned second insulating layer 16', the patterned first conductive layer 14' and multiple trenches 42 are formed. The spacer 30 formed in FIG. 7 extends from the patterned mask layer 24' downwards to and cover the patterned second conductive layer 22', the patterned second insulating layer 16', and the patterned first conductive layer 14'.

Figure 9A:
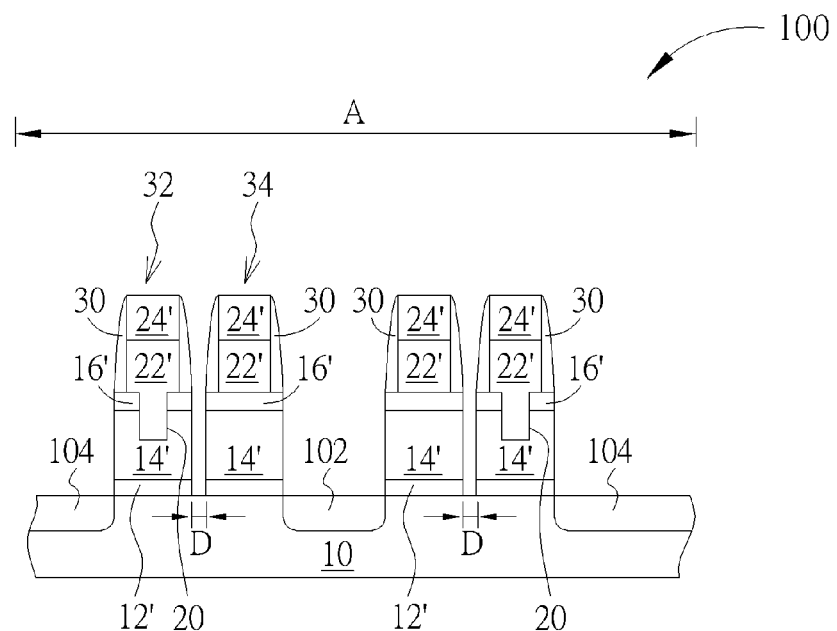
FIG. 9A illustrates a variant of the gate structure of the flash memory in accordance with one preferred embodiment the present invention.
Figure 9B:
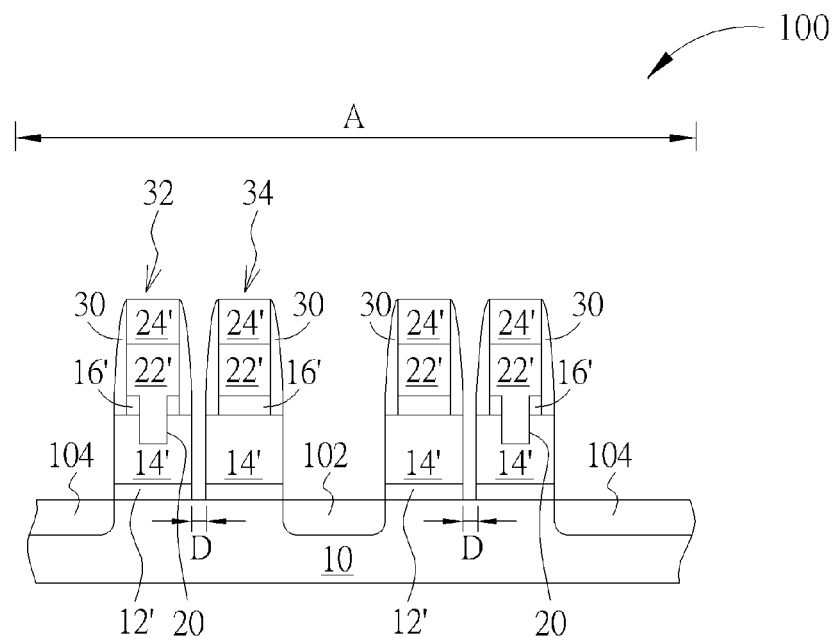
FIG. 9B illustrates a variant of the gate structure of the flash memory in accordance with another preferred embodiment the present invention.
Figures 9C, 10:
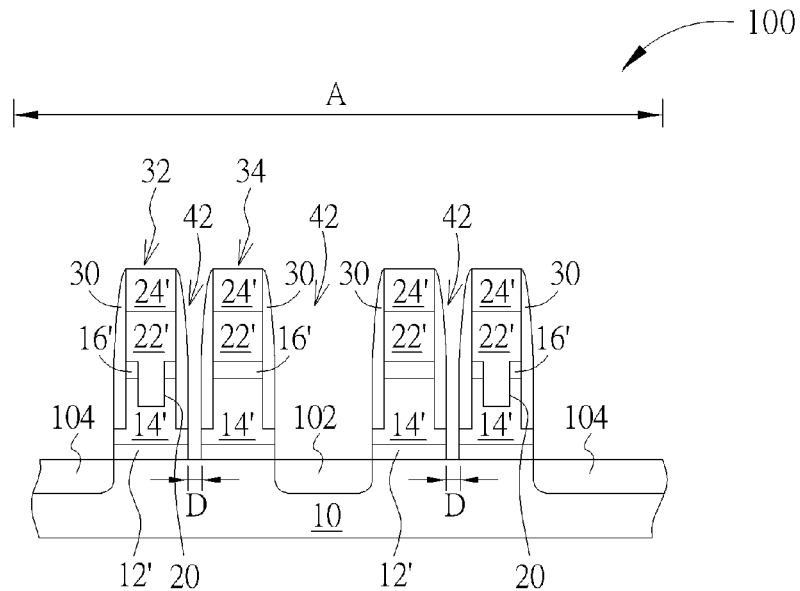
FIG. 9C illustrates a variant of the gate structure of the flash memory in accordance with another preferred embodiment the present invention.
FIG. 10 illustrates the voltages for the operation of the flash memory structure of the present invention under different modes.

In the previous FIG. 8A, FIG. 8B and FIG. 8C, the patterned mask layer 24' and the spacer 30 serve as a mask in later steps to etch all the way to the surface of the substrate 10 to form the flash memory structures 100 as illustrated in FIG. 9A, FIG. 9B and FIG. 9C. FIG. 9A is a follow-up of FIG. 8A, FIG. 9B is a follow-up of FIG. 8B and FIG. 9C is a follow-up of FIG. 8C.

Please refer to FIG. 7 and FIG. 10 at the same time. FIG. 10 illustrates the voltages for the operation of the flash memory structure of the present invention under different modes. The flash memory structure 100 of the present invention includes a first gate structure 32, a second gate structure 34 and a small gap D disposed between the first gate structure 32 and the second gate structure 34 so the Fowler-Nordheim tunneling effect or a band-to-band tunneling effect may be employed for the erase operation of the flash memory. In accordance with one preferred embodiment of the present invention, to program the flash memory structure 100 is carried out by applying 1-4 volts to the select gate, applying 0 voltage to the substrate 10, applying 3-5.5 volts to the source 102, applying 0 voltage or 1-2 µA to the drain 104 and applying 8.5-13 volts to the control gate.

To read the flash memory structure 100 is carried out by applying a Vcc voltage to the select gate, applying 0 voltage to the substrate 10, applying 0 voltage to the source 102, applying 1 volt to the drain 104 and applying a Vcc voltage to the control gate.

When Fowler-Nordheim tunneling effect is used to erase the flash memory structure 100, the operation is done by applying 0 voltage to the select gate, applying 7-11 volts to the substrate 100, applying 0 voltage to the source 102 or keeping the source 102 floating, applying 0 voltage to the drain 104 or keeping the drain 104 floating, and applying −7 to −11 volts to the control gate.

When the band-to-band tunneling effect is used to erase the flash memory structure 100, the operation is done by applying 0 voltage to the select gate, applying 0 voltage to the substrate 10, applying 5 to 9 volts to the source 102, applying 0 voltage to the drain 104 or keeping the drain 104 floating, and applying −7 to −11 volts to the control gate.

The present invention uses the spacers to define the gap disposed between a first gate structure and a second gate structure by self-alignment so the size of the gap disposed between the first gate structure and the second gate structure is smaller than the conventional one generally define by a photomask and the overlay shift problem by using a photomask can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory structure, comprising:
   a first gate structure;
   a second gate structure; and
   a source and a drain respectively disposed at one side of said first gate structure and at the other side of said second gate structure;
   wherein said first gate structure and said second gate structure are formed on a substrate next to each other, and there is a gap disposed between said first gate structure and said second gate structure;
   said first gate structure and said second gate structure respectively comprise: a first insulating layer, a first conductive layer, a second insulating layer, a second conductive layer, a mask layer and a spacer to cover the sidewall of said mask layer,
   wherein said spacer serves as an etching mask and said gap is self-alignment defined by using said spacer;
   wherein said first conductive layer and said second insulating layer of said first gate structure have a trench and said second conductive layer extends to said trench to connect said first conductive layer, and said first gate structure serves as a select gate and said second gate structure serves as a control gate and a floating gate;
   wherein there is no implanted area in said substrate between said first gate structure and said second gate structure.

2. The flash memory structure of claim 1, wherein said spacer extends downwards to cover the sidewall of said second conductive layer.

3. The flash memory structure of claim 1, wherein said spacer extends downwards to cover the sidewall of said second conductive layer and of said second insulating layer.

4. The flash memory structure of claim 1, wherein said spacer extends downwards to cover the sidewall of said second conductive layer, of said second insulating layer and said first conductive layer.

5. The flash memory structure of claim 1, wherein said gap disposed between said first gate structure and said second gate structure is 50 to 400 Å.

* * * * *